United States Patent [19]

Brown et al.

[11] Patent Number: 5,017,741

[45] Date of Patent: May 21, 1991

[54] ROTARY DIGITAL CONTACT ENCODER SUBSTRATE

[75] Inventors: Kenneth Brown, Evansville, Ind.; Richard E. Riley, Riverside, Calif.

[73] Assignee: Hamilton Standard Controls, Inc., Farmington, Conn.

[21] Appl. No.: 330,016

[22] Filed: Mar. 29, 1989

[51] Int. Cl.$^5$ .................. H05K 1/00; H01H 19/00
[52] U.S. Cl. ................... 174/260; 174/262; 200/11 DA
[58] Field of Search ............... 200/11 DA, 292, 11 G, 200/11 J, 11 K, 11 TW; 174/250, 255, 256, 260–266

[56] References Cited

U.S. PATENT DOCUMENTS

| | | | |
|---|---|---|---|
| 2,474,988 | 7/1949 | Sargrove | 174/262 |
| 3,340,491 | 9/1967 | Keakin | 29/622 |
| 3,492,623 | 1/1970 | Yamada | 338/308 |
| 4,263,341 | 4/1981 | Martyniak | 174/262 X |

Primary Examiner—J. R. Scott

[57] ABSTRACT

A rotary digital contacting encoder (FIG. 1) including a base (5), comprising - a base epoxy disk (501) with three external, pre-molded in place, connector pins ($P_1$-$P_3$) on its exterior side extending through it, and a conductive layer in the form of two concentric layer rings (502 & 503; FIG. 4); and - an encoder element made of a "Kapton" insulating substrate (510) carrying two, like concentric cog rings (511B & 511A; FIGS. 3 & 7) on its top side. Conductive vias (512 & 513) electrically interconnect each respective cog ring with its respective conductive layer ring and its respective external connector pin, the vias forming conductive paths through the insulating substrate between the conductive layer and the cog rings. The presence of the conductive layer 502/503, which can be screen printed on the base disk, greatly simplifies the relative alignment of the encoder element, conductor pads and terminals. Using the conductive layer the encoder element can be positioned at almost any angular location, while still obtaining proper electrical contact with the terminal pins. The via tunnels are etched out (FIG. 6A) and then filled with conductive materials before the encoder element (510/511A-B) is bonded to the base element (501/502-503).

11 Claims, 5 Drawing Sheets

ROTARY DIGITAL CONTACT ENCODER SUBSTRATE

REFERENCE TO RELATED APPLICATIONS

The application relates to some of the same subject matter as assignee's applications:, U.S. Ser. No. 07/264,588 (now U.S. Pat. No. 4,845,839) filed Oct. 31, 1988, entitled "Precision Resistance Film and Terminating Method and Product"; and U.S. Ser. No. 07/329,737 filed on even date herewith by the same inventors entitled "Electrical Interconnect Substrate Design & Method for Digital Encoders And the Like"; the disclosures of which are incorporated herein by reference.

TECHNICAL FIELD

The present invention relates to the design and manufacture of electrical components, such as, for example, digital contacting encoders or pulse generators and the like, whether linearly or rotatably moved. Additional examples of other electrical components, besides rotary and linear encoders, which could benefit from the use of the present invention include potentiometers, position sensors, variable resistors, switching systems, magneto-resistive devices, etc. More particularly the present invention relates to an electrical interconnect substrate design for such electrical components, which allows for greater ease in manufacture of the device and, even more particularly, provides for improved electrical interconnection across an insulating substrate.

BACKGROUND ART

Rotary digital contacting encoders or rotary pulse generators are known, in which a cog-type conductive pattern is provided on an insulating substrate, to which three external electrical connections are selectively made and over which a "U" shaped, bridging, wiping contact is rotated. As the "U" shaped contact is rotated, it alternately connects a common pin or connection (for example, pin "2") for a limited period of time to one and then the other of the other two connections (namely, the remaining pins "1" & "3"), alternately and sequentially making bridging interconnection between the common pin and one of the other pins, producing digital-type, pulsed electrical signals across the pins, having the wave forms shown in FIG. 8 hereof.

Figure 7:
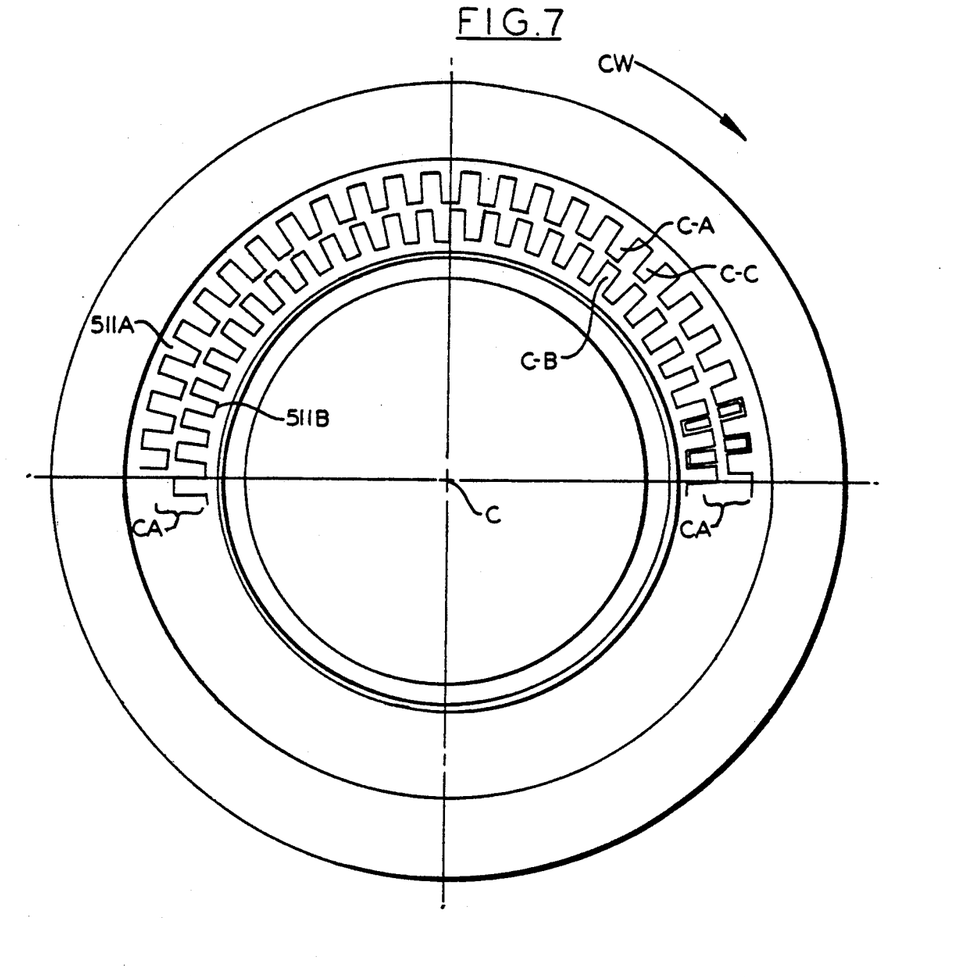
FIG. 7 is a plan, detail, close-up view of the exemplary cog pattern of FIG. 3 but with the former being taken from the opposite side of the latter.

The cog pattern in such devices typically includes two, concentric cog rings with generally opposed, alternating cogs, as shown in detail in FIG. 7 hereof, and are quite small and fine in their design. They involve gaps between the generally opposed, radially extended cogs of, for example, only fifty-five ten-thousandths (0.0055") of an inch with a ring width of, for example, only thirty-nine thousandths (0.0039") of an inch.

The cogs of the rings are either directly opposed, as, for example, is shown in U.S. Pat. No. 4,443,670 of Nakamura et al issued Apr. 17, 1984, or somewhat staggered or axially off-set, as shown in FIG. 7 hereof.

In the manufacture of such devices in the prior art, the electrical connections to the concentric rings were directly made to them, usually peripherally as shown in the '670 patent, resulting in the need for relatively precise alignment and positioning of the electrical connections with the rings, with very little tolerance being allowed, causing manufacturing problems and difficulties.

The present invention is designed to avoid these manufacturing problems and difficulties.

DISCLOSURE OF INVENTION

Thus, the present invention is directed to the design and manufacturing of various electrical components, such as, for example, a rotary digital contacting encoder or pulse generator, or other like components, which design and manufacturing methodology avoids the precise positioning and alignment requirement for the external electrical connections with the cog rings or other electrical signal affecting strips, as required in the prior art.

The present invention achieves these objectives by providing in, for example, the exemplary embodiment, a circumferentially extended, circular conductive layer in the form of two concentric rings on a base, which layer ultimately is used to carry an insulating substrate with the cog pattern on it, the presence of which conductive layer allows great latitude in the positioning and alignment of the electrical connections with the cog rings but the presence of which insulating substrate requires the use of supplemental electrical connections to bridge across the substrate.

For example, with respect to the use of the conductive layer rings, the exemplary embodiment hereof allows the positioning of the alternate signal pin connections anywhere along approximately three-hundred-and-forty (340°) degrees of the circumference of the cog rings and a tolerance of, for example, twenty to thirty thousandths (0.020–0.030") of an inch placement in the "x & y" directions and still achieve reliable and accurate electrical interconnections to the rings.

To solve the latter problem of using an insulating substrate to carry the conductive cog pattern, the present invention provides conductive vias or tunnels through the insulating substrate, preferably in the form of two relatively small holes through the substrate, one conductively interconnecting the inner cog ring with the inner conductive layer ring and the other separately conductively interconnecting the outer cog ring with the outer conductive layer ring.

In the exemplary embodiment, which includes having the conductive cog pattern made on an electrically insulating substrate of, for example, Dupont's "Kapton", a conductive silver layer is provided, for example, by being screen printed, on a base of, for example, molded epoxy. The conductive layer includes two concentric rings, following the general configurations of the concentric cog rings.

If it is desired to have the ring pins lie on the periphery of the same circle, one of the concentric rings of the conductive layer is gapped, and the other concentric ring includes a radially extended leg projecting into the gap. If the ring pins are radially off-set with respect to one another, two complete, concentric circles can be used for the conductive layer.

In the exemplary embodiment described in detail below a molded epoxy base provides an external wall through which three, externally extended, orthogonal pins make electrical connection to the device's internal electrical components, two of which are ultimately made to the concentric cog rings. The cog pattern on the "Kapton" substrate is positioned on the epoxy base, with the ring pins making electrical contact with the rings through the conductive vias, one ring pin within the gap through the radially extended leg of the outer ring in the silver layer and the other through the inner conductive ring layer.

As noted, the final interconnection of the conductive layer rings with the cog rings on the insulating substrate is made by providing holes or via openings or tunnels through the substrate, preferably by etching out the holes through the "Kapton" substrate, and filing the holes or via openings with conductive material, in accordance with the teachings of the present invention.

Applications for the exemplary finished digital contacting encoders of the present invention include, for example, the home satellite dish market and various electronic instruments, etc.

The digital contacting encoder of the present invention can be substantially smaller and more rugged than other comparable products on the market. Despite its sturdy design, the unit can be made to weight, for example, only a half an ounce (0.5 oz.) with exceptionally efficient operation and with rotational life rated in excess of, for example, two hundred thousand (200,000) shaft revolutions Additional examples of other electrical components which could benefit from the use of the present invention include, in addition to encoders (both rotary and linear), potentiometers, position sensors, variable resistors, switching systems, magneto-resistive devices, etc.

Typically, each of these components will include:

a rigid base having an exterior side and an interior side;

at least two, externally exposed electrical contacts on the exterior side of the base, one of them being a common contact and the other being a strip contact for connecting a strip of conductive material within the component into an external circuit;

an electrical signal varying element, including:

a relatively rigid substrate, which typically is made of insulating material, and has a top side and an underside, and at least one, longitudinally extended strip of signal affecting, conductive material located on the top side of the substrate; and a movable, bridging member electrically connected to the common contact and associated with the strip, movably sweeping along the strip causing an electrical signal imposed across the common contact and the strip contact to vary due to the changing relative position of the bridging member with respect to the length of the longitudinally extended strip.

The vias of the present invention are used to provide an electrical interconnection between the strip material and the conductive layer through the insulating substrate.

The foregoing and other features and advantages of the present invention will become more apparent from the following further description and its related drawings.

BRIEF DESCRIPTION OF DRAWINGS

FIG. 1 is an exploded, perspective view of an exemplary rotary digital contacting encoder with the electrical interconnect substrate design of the present invention, with the upper substrate section and the housing section turned inwardly toward the viewer to show the internal structure, of the encoder; while FIGS. 2A & 2B are front and rear views, respectively, of the exemplary encoder of FIG. 1.

BEST MODE FOR CARRYING OUT THE INVENTION

Structure & Operation of Encoder

Figures 1, 2A, 2B:
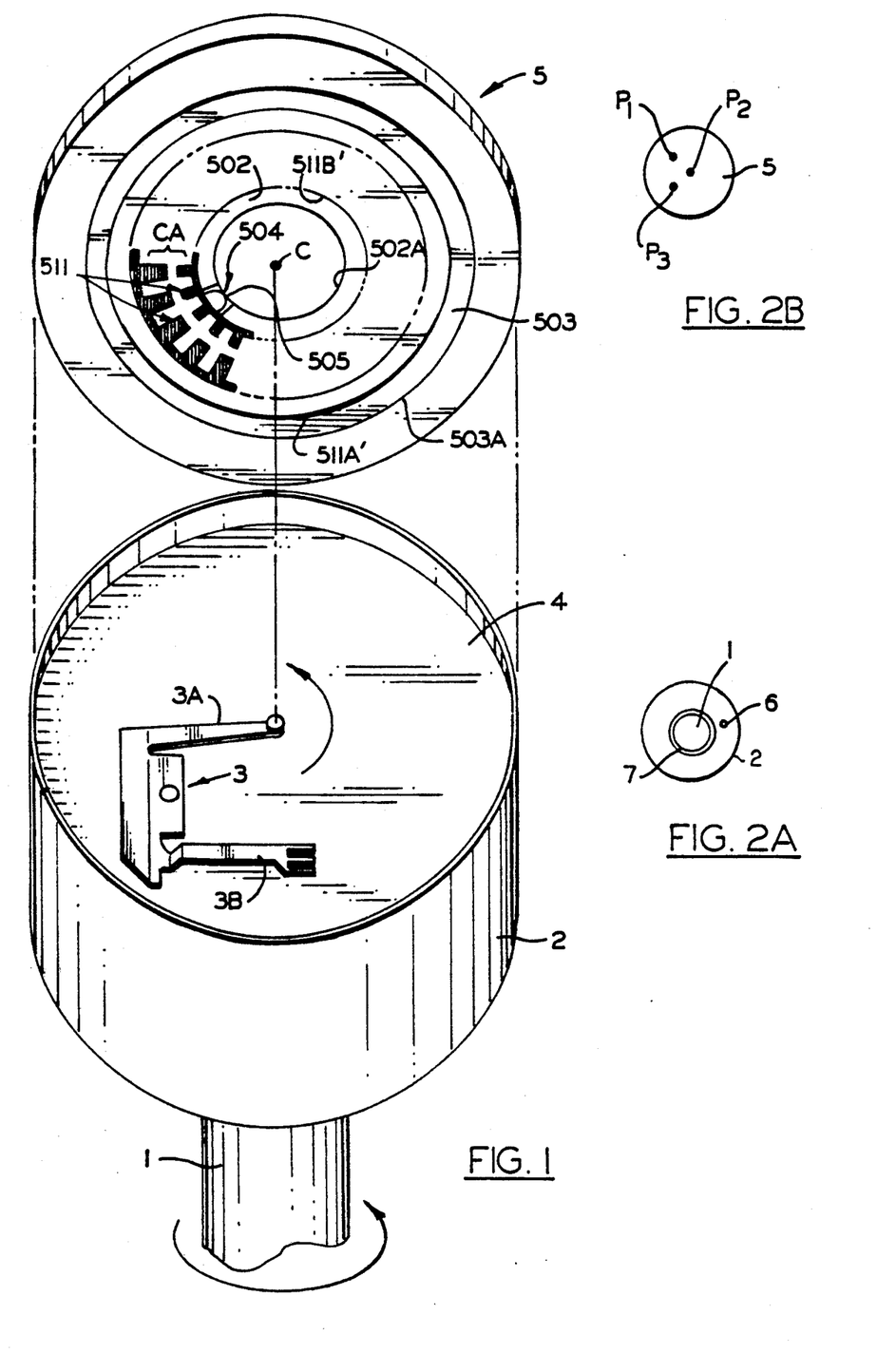

With reference to FIG. 1 the exemplary rotary digital contacting encoder or pulse generator includes a shaft 1 and a cylindrical housing 2, in which the rotation of the shaft causes the internal "U" shaped wiping bridging contact 3 on base 4 to rotate. A bottom or rear base 5, carrying a conductive cog pattern, is affixed to the housing 2 with, for example, an adhesive, so that, as shaft 1 is rotated, the "U" shaped contact is wiped across the fixed cog pattern, alternatively bridging the common pin $P_2$ across opposed, juxtaposed ones of the cogs, as explained more fully below.

The "U" shaped contact 3 includes two, extended, parallel, resilient arms 3A & 3B, with the arm 3A always being in electrical contact or connection with the common external connection pin $P_2$, which is centrally located in the center "C" of the bottom base 5. The arm 3B on the other hand is positioned to be wiped across the central area "CA" of the two opposed cog rings 511, bridging across the then contacted one of the radially extended, opposed cogs to the center area "C", alternately connecting the inner and outer cog rings electrically to the center or reference pin $P_2$, to which rings the other pins $P_1$ & $P_3$ are electrically connected, as explained more fully below.

The wiper contact arm 3B terminates in at least two or more sub-arms or fingers, which are laterally spaced from one another, with the inner-most one (as viewed from the perspective of FIG. 1) sweeping across the cogs of the inner cog ring 511B and the outer-most one sweeping across the cogs of the outer ring 511A.

As can be seen in FIG. 2A, the front of the housing 2 includes a sleeve 7, through which the shaft 1 passes. The outer surface of the sleeve 7 typically would be threaded for connecting the housing 2 to a surface with a nut. The front of the housing 2 also includes an orthogonally extended, male positioning pin 6, which allows the housing to be mounted onto, for example, the back-side of a panel (not illustrated) with a desired angular alignment, with the male pin 6 being mated with an appropriately positioned female orifice in the panel, while the sleeve 7 would extend through a hole in the panel to be affixed with a nut on the other side. Appropriate connection would then be made to the shaft 1 to cause it to be rotated.

Figures 6, 6A:
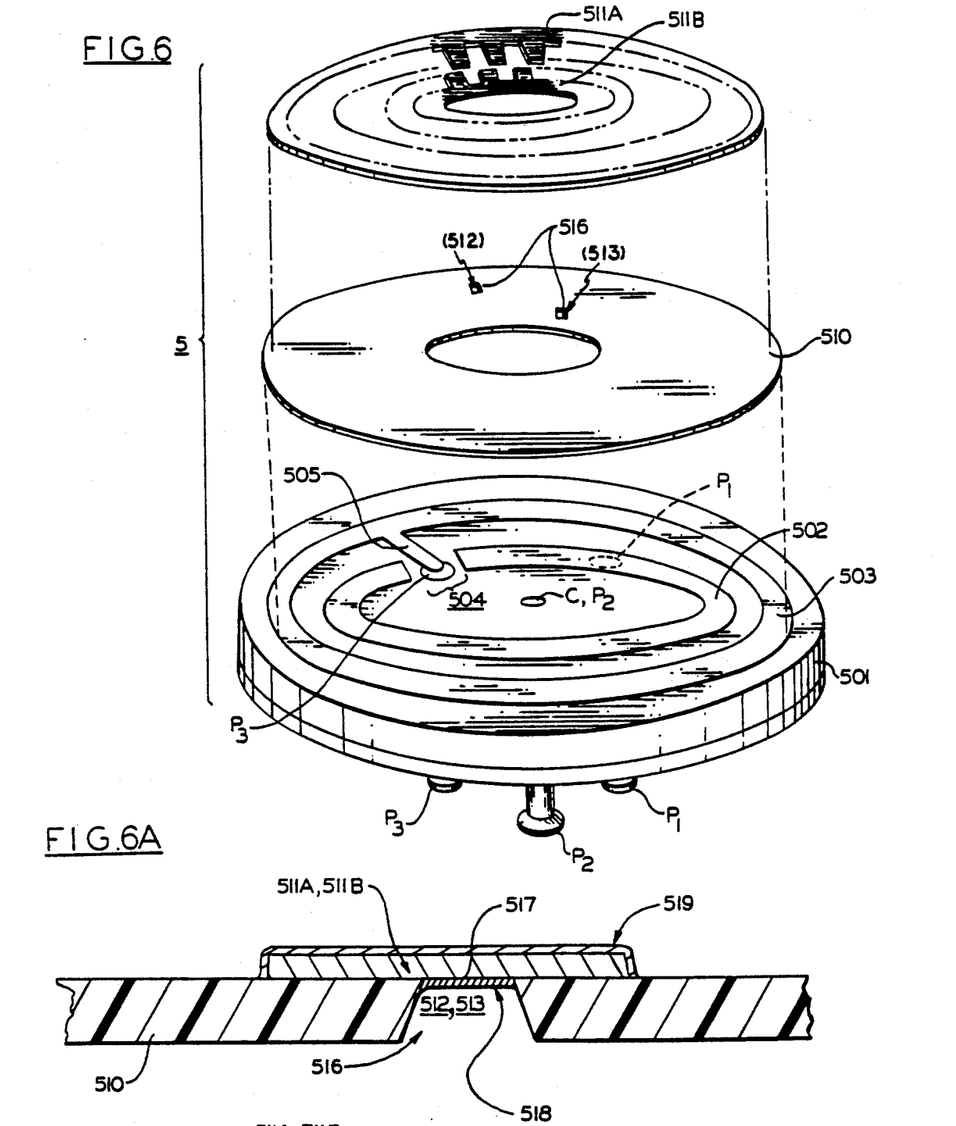
FIG. 6 is an exploded, side perspective view of the encoder element, including the cog pattern and its substrate, and the epoxy base and its conductive layer for the encoder of FIG. 1, with the conductive layer being provided in accordance with the teachings of the present invention.
FIG. 6A is a partial, side, cross-sectional view showing in close-up detail one of the conductive vias being formed through the insulating substrate for the cog rings to provide an electrically conductive path between the cog rings and their respective conductive layer rings on the underside of the substrate and ultimately to their respective bottom external connecting pins.
Figure 8:
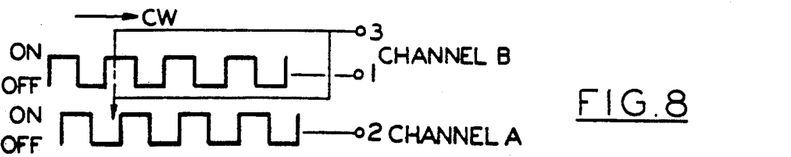
FIG. 8 is a wave form diagram illustrated the digital-type pulses generated across pins "1" & "2" and pins "1" & "3" of the exemplary encoder of FIG. 1.

As seen in FIGS. 2B & 6, the rear end of the base 5 includes three, orthogonally extended external pins or contacts $P_1$-$P_3$ for connecting the encoder into a circuit external to the encoder. The external circuit typically would include a reference or power DC voltage supply of, for example, five volts. As shaft 1 is rotated in a clockwise ("CW") direction, the circuit produces the digital-type, pulsed wave forms as illustrated in FIG. 8 as channels "A" & "B" at the cog pins $P_1$ & $P_3$. This is caused by the action of the wiping contact arm 3B alternately switching in and out a cog from one ring and then the other ring and cyclically back and forth with respect to the DC powered central pin $P_2$.

The encoder element, comprising the cog pattern created by the two longitudinally extended, cog rings or strips 511A & 511B, on the substrate 510, thus serves as a signal varying element, with the relative position of the movable contact arm or bridging member 3B with respect to the cog rings, affecting the signal "seen" at the external ring or strip pins $P_1$ & $P_3$, as the current alternately flows through the conductive material of the strips.

Thus, for example, cog C-A of the outer cog ring 511A (note FIG. 7) is switched into the power circuit and then cog C-B from the concentric inner ring 511B is switched into the power circuit, and then outer cog C-C, and so forth, during the rotation of the shaft 1, producing the pulsed signals in the two channels "A" & "B".

It is noted that the cogs of the outer ring 511A are phase shifted or angularly off-set with respect to the cogs of the inner ring 511B and that the three sub-arms or fingers of the wiping contact arm 3B are skewed in that they do not lie in the same radial line as they are swept across the central area "CA" of the cog rings 511A & 511B. As a result, there is a phase difference between the pulsed signals, as illustrated in FIG. 8. If desired, the parts could be arranged and designed, so that no two cogs are ever simultaneously connected to the central pin $P_2$.

Figure 4:
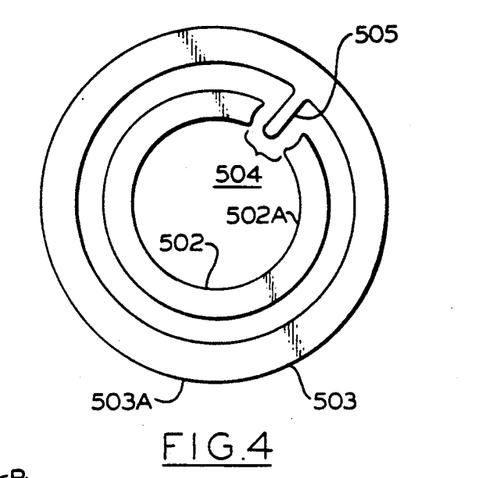

In the exemplary embodiment illustrated, it is desirable to have the ring pins $P_1$ & $P_3$ lie on the periphery of the same circle, coincident with, for example, the inner cog ring 511B and that defined by the inner conductive layer ring 502 (note particularly FIG. 6). Accordingly, as can be seen in FIG. 4, the conductive layer on the base 5 is provided in the form of two concentric circles, the inner one (502) of which includes a gap 504, into which a radially extended leg 505 from the outer ring 503 extends, to which is connected the ring pin $P_3$. The gap 504 and the connecting leg 505 are positioned to coincide with the hole in the epoxy disk 501 forming the base 5 into which the $P_3$ (or, alternatively, the ring pin $P_1$) is placed (note FIGS. 5 & 6).

Figure 3:
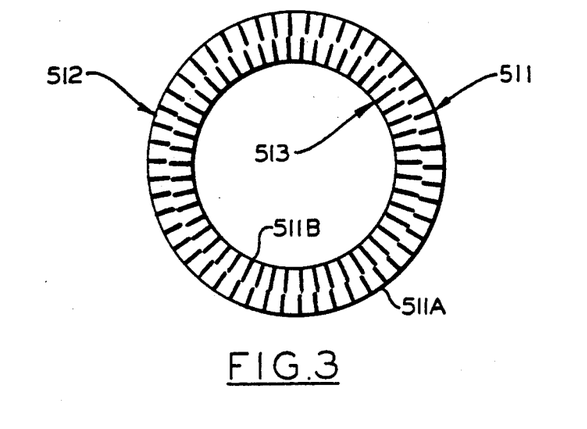
FIGS. 3, 4 & 5 are plan views to similar scale of the associated cog rings, supplemental conductive layer rings and rear end, respectively, of the encoder of FIG. 1, the conductive layer rings of FIG. 4 being provided in accordance with the teachings of the present invention; with FIG. 5 being substantively identical to FIG. 2A but to a different scale.
Figure 5:
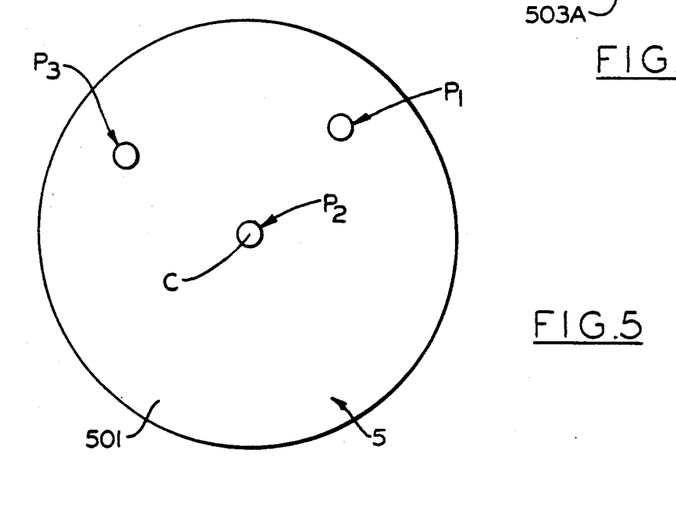

For better visualization of how the external connecting pins $P_1$-$P_3$, the concentric, conductive layer rings 502 & 503 and the concentric cog rings 511B & 511A are respectively associated together, it is noted that FIGS. 3-5 are substantially to the same relative scale.

To achieve electrical interconnection between the concentric, conductive layer rings 502 & 503 and the concentric cog rings 511A & 511B through the insulating substrate 510, conductive vias or tunnels 512 & 513 are formed between them through the insulating substrate 510

Each of the via tunnels 512 & 513 typically are about two hundredths (0.02") of an inch in diameter, when in circular form, but preferably are oblong, as generally illustrated, extended along the radial direction to follow a selected one of the radially extended cogs which it would underlie. Alternatively, they can be square or any other desired shape. They thus form holes of relatively small size, having an exemplary but preferred cross-sectional area of only about six hundredths (0.06 sq.") of a square inch.

Figure 6B:
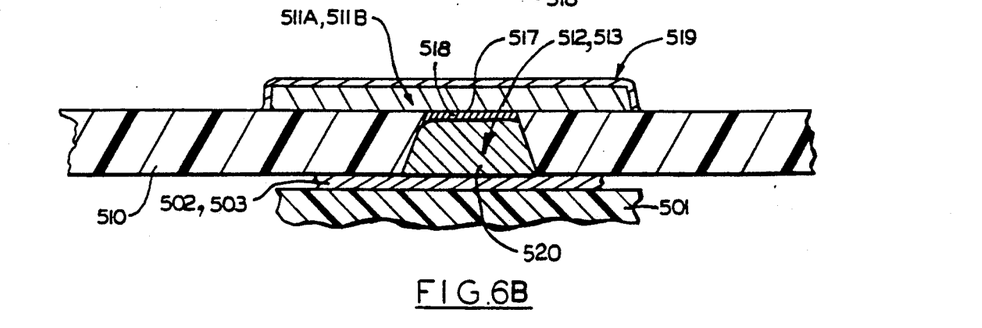
FIG. 6B is a partial, side, cross-sectional view showing in close-up detail one of the conductive vias, similar to FIG. 6A, but after it has been completely formed through the insulating substrate.

The via holes or tunnels 516 are filled with conductive material, such as, for example, a conductive plastic or epoxy material 520 (see FIG. 6B), through the hole 516 for the via can be established by, for example, wire bonding, or various types of welding operations.

The vias 512, 513 thus establish the final link in the conductive path from the cog ring through the insulating substrate 510 and its respective conductive ring layer 503/502 and its respective ring pin $P_1$/$P_3$ and attain electrical continuity between the conductor cog patterns 511 and the encoder element mounting surface on the underside of the "Kapton" layer or film 510.

It should be further understood that, within the device, there is only one conductive path between each strip 511B/511A of the cog pattern and its respective ring or strip contact or pin $P_1$/$P_3$ and that is through its respective conductive layer ring or strip 502/503. Thus, the conductive layer provides a serial link in the only conductive path from each of the external contact pins to its respective signal affecting strip.

As shown in FIG. 6A, a gold plating 519 can be provided on the copper cog pattern forms by rings 511A & 511B for enhanced conductivity and contact with the wiping contactor arm 3B.

Method of Manufacture of Encoder

Figure 9:
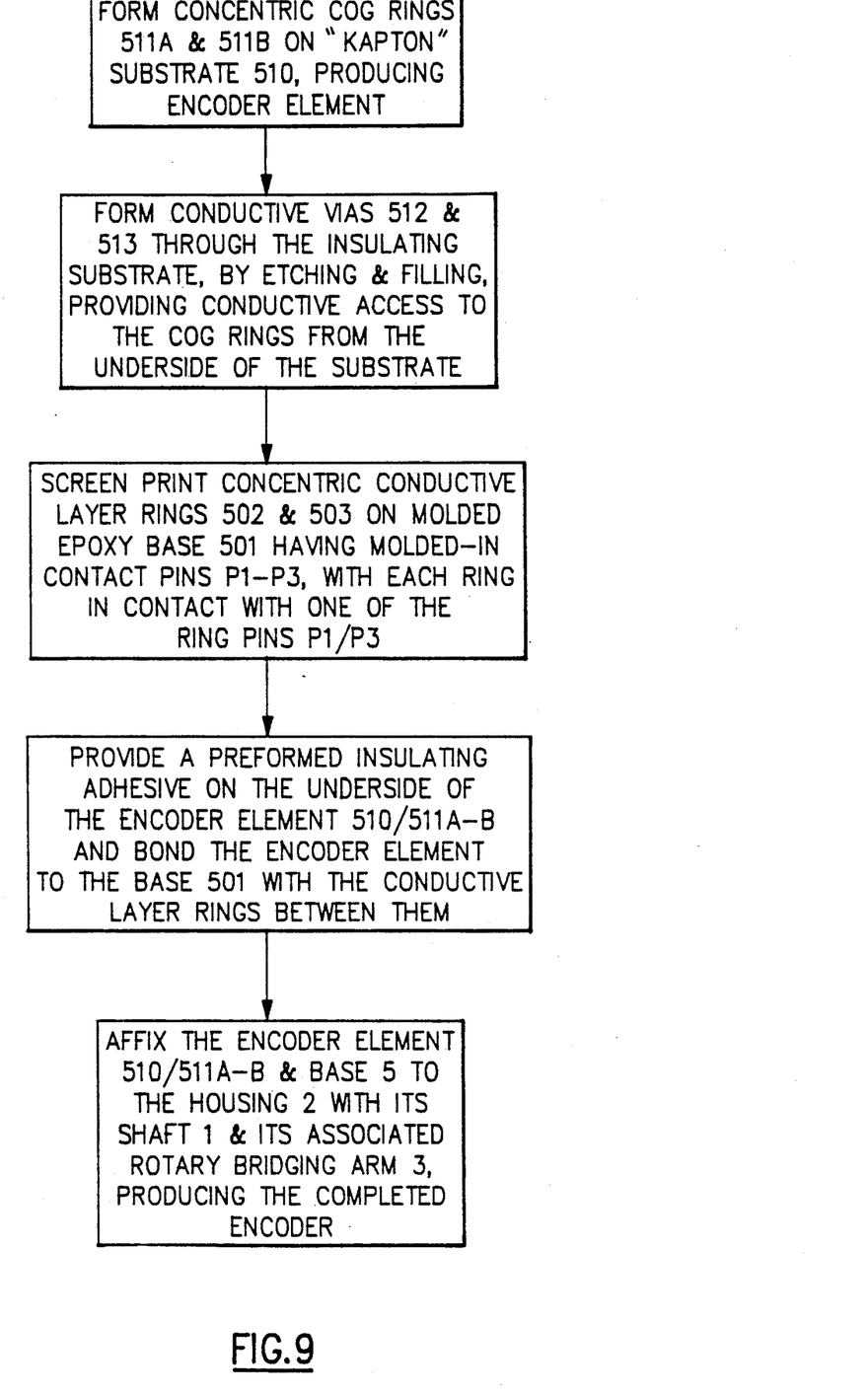
FIG. 9 is a flow chart diagram illustrating the exemplary manufacturing methodology of the present invention for making the exemplary encoder of FIG. 1

To manufacture the bottom base 5, which includes the cog rings 511 A & 511B, the insulating substrate 510, the conductive layer rings 502 & 503 and the epoxy base 501, the following exemplary method, summarized in the flow chart of FIG. 9, can be used.

To form the cog/substrate encoder element, a sheet or film of plain "Kapton", which is made of a polyimide resin, may be used as the substrate 501. A copper or other conductive layer is deposited onto the top side of the "Kapton" substrate, from which layer the cog rings 511A & 511B ultimately will be formed. If so desired, a gold plate layer can be added on top of the copper layer for enhanced conductivity.

A layer of photo-resist material is applied over the copper layer and exposed and developed to form the pattern of the cog rings 511A & 511B. The copper layer is then photo etched, leaving the copper in the pattern of the cog rings 511A & 511B on the top side of the "Kapton" substrate, forming the encoder element of the device. Circular cuts are then made through the substrate by stamping or die cut, forming the cog/substrate 510/511A-B, in the form illustrated in FIGS. 6 & 7.

Either before or after making the stamped cuts, conductive vias 512 & 513 are formed through the "Kapton" substrate 510. For example, the "Kapton" material can be etched away at the desired locations of the vias 512 & 513 producing the via holes 516 through the substrate to the cog rings, and the etched out areas filled with, for example, a silver epoxy.

When the encoder element 510/511A-B is manufactured by the tape automated bonding (TAB) continuous process, the method chosen using a two layer tab tape to form the conductive vias or tunnels 512 & 513 includes the chemical etching of two small holes 516 (note FIG. 6A) in through the bottom or underside of the insulating substrate 510 until the copper layer for the respective cog ring 511B/511A is reached, exposing an underside portion 517 of the copper conductor on the top surface of the substrate. As can be seen in FIG. 6A, the cross-sectional width of the hole 516 is greater at the underside surface than at the top surface of the substrate 510, the side walls of the hole being flared inwardly as the hole progresses from the underside to the top side.

The exposed copper 517 is then preferably plated with, for example, gold or nickel and gold, to form a reliable, low resistance termination pad 518. As noted above and as illustrated in FIG. 6B the holes 516 for the vias 512 & 513 are then filled w conductive material, such as, for example, a conductive plastic or epoxy material 52320, or the conductive path through the hole for the via can be established by, for example, wire bonding, or various types of welding operations.

Since the size and positioning of the etched hole for each via 512, 513 is well controlled, the electrical connections involved may be easily mechanized, if so desired.

To form the epoxy disk 501 with the conductive layer rings 502/503 on its interior side, the epoxy disk 501 is initially molded in the desired form with three holes through it to accommodate the external pins $P_1$-$P_3$ and preferably the pins pre-molded in place extending through the thickness of the disk to terminate substantially co-planar with the interior surface of the base disk. The conductive layer in the form of the concentric rings 502 & 503 are then preferably screen printed on the interior side of the disk 501, with the gap 504 and the connecting arm 505 positioned over one of the ring pin holes for either the pin $P_1$ or $P_3$, and with the radius of the inner and outer concentric rings 502/511B and 503/511A being substantially coincident. When the pins are pre-molded into the base disk 501, the conductive layer is printed on the base disk, so that the radially extending arm 505 and the gap 504 coincide with the terminus of the selected ring pin (e.g. pin $P_3$ as illustrated in FIG. 6).

The conductive layer rings are concentrically spaced and electrically isolated from one another, with the inner, peripheral edge 502A of the inner ring 502 preferably extending past the inner peripheral edge 511B' of the inner cog ring 51!B, and likewise with respect to the outer peripheral edges 503A/511A' of the outer rings 503/511A, as can be seen in FIG. 1. Thus, the radial extent or effective width of the combined conductive layer rings 502 & 503 is greater than the combined radial extent or effective width of the combined cog rings 511A & 511B. This greater, relative extent or width adds to the allowable manufacturing tolerance with the interconnect substrate or base design of the present invention.

An exemplary material for the screen printing of the conductive layer for the conductive layer rings is a silver powder in an organic resin with solvents. The screen printed, conductive layer rings 502/503 provide separate conductive paths between each via and its respective cog ring, and its respective ring pin.

Besides screen printing for providing the conductive layer rings 502/503 on the base 501, evaporating or sputtering could be used, but screen printing is currently preferred for cost reasons. An exemplary thickness for the screen printed layer is twelve to thirty-five (12-35) micrometers or microns. In place of using the silver powder in an organic resin with solvents, exemplary alternate materials are gold, palladium, silver or copper, etc.

The presence of the conductive layer 502/503 greatly simplifies the alignment of the encoder element, conductor pads and terminals. Using the conductive layer 502/503, the encoder element can be positioned at almost any angular location, while still obtaining proper electrical contact with the terminal or ring pins $P_1$ & $P_3$.

In joining and bonding the cog/substrate 510/511 to the base 501 with the conductive layer rings 502 & 503 at the underside of the substrate 510 between it and the base disk 501, a non-conductive, transfer adhesive is provided on the underside 514 of the "Kapton" substrate 510. An exemplary adhesive for joining the two sections or sub-elements together is a preform cut from a "B" stage epoxy.

The two sections or elements are then joined and bonded together using the adhesive to affix them with the longitudinally extended, concentric cog rings or strips in at least general alignment and substantially parallel with the longitudinally extended, conductive layer rings.

The electrical contact pins $P_1$-$P_3$ are attached to the disk 501 by, for example welding, making sure that the concentric conductive layer rings 502/503 will make good electrical contact with their respective ring pins $P_1$ & $P_3$. Alternatively and preferably, the three pins $P_1$-$P_3$ could be molded in place during the initial molding of the disk 501.

The foregoing methodology utilizes tape automated bonding (TAB) in a continuous process, and reference is had to co-pending application Serial No. 07/264,588 (now U.S. Pat. No. 4,845,839) referred to above.

The final assembly with the housing 2 and its shaft 1 and bridging contactor arm 3 can be completed manually with small tools and holding fixtures, or easily automated, as may be desired.

Although this invention has been shown and described with respect to a detailed, exemplary embodiment thereof, it should be understood by those skilled in the art that various changes in application form, detail, methodology and/or approach may be made without departing from the spirit and scope of this invention.

For example, if the encoder were linear rather than rotary, the cog rings and conductive layer rings or strips would be in the form of longitudinally extended, straight, parallel strips rather then concentrically curved strips in the form of the circular rings illustrated. In such an instance, the cogs of the longitudinally extended, straight strip could be said to laterally extend from the strip and be longitudinally spaced. For purposes of this application, it should be understood that the phrases "laterally extended cog" or "longitudinally spaced cogs" should be read to cover generically both the cogs as extending from either a longitudinally extended, straight strip or a curved strip; i.e., the cogs of a curved, ring cog pattern could be considered to be "laterally extended" and "longitudinally spaced" for purposes of this application. If the electrical component was a variable resistor with, for example, two pins, rather than the three pins for the encoder illustrated, rather than two sets of concentric ring pairs, only one set would be necessary, and, as before with respect to a linear encoder, the set could either be longitudinally extended in a straight line or curved, if rotary. The foregoing is of course only exemplary of the changes in detail that would be necessary, as the principles of the present invention are applied to other forms of electrical components, besides the exemplary rotary encoder detailed above.

Having thus described at least one exemplary embodiment of the invention, that which is new and desired to be secured by Letters Patent is claimed below.

We claim:

1. An electrical component, such as, for a digital contacting encoder or the like, comprising:
   a base having an exterior side and an interior side;
   at least two, externally exposed, electrical contacts on the exterior side of said base, one of them being a common contact and the other being a strip contact;
   an electrical signal varying element, including:
      a substrate of insulating material separate from and located above said base and being on the interior side of said base, said substrate having a top side and an underside with the underside of said substrate being directed toward said base, and
      at least one strip of signal affecting, conductive material formed on the top side of said substrate, said strip being electrically connectable to said common contact;
   a conductive layer located on the interior side of said base between said substrate and said base serving as an electrical interconnect layer and being electrically connected to said strip contact; and
   at least one conductive via formed completely through said substrate, providing a conductive path through the insulating substrate from the conductive strip on the top side of said substrate, with said via extending down through said substrate to the underside of said substrate and being electrically connected to said conductive layer, at least one via being included for each said strip.

2. The electrical component of claim 1, wherein:
   each said via includes an opening defining a hole of relatively small size within which opening is included some conductive material extending continuously from end to end of said opening from said top side to said underside of said substrate.

3. The electrical component of claim 2, wherein:
   said opening has a cross-section size of the order of about six hundredths of a square inch.

4. The electrical component of claim 2, wherein:
   each said via also extends through its respective strip, with the cross-sectional size of each said opening being greater at the underside than at the top side of said substrate.

5. The electrical component of claim 2, wherein:
   each said opening is filled with conductive material.

6. The electrical component of claim 2, wherein:
   a plated conductive pad layer is included within said opening at the top end portion thereof in face-to-face engagement and contact with the underside of said conductive strip.

7. The electrical component of claim 1, wherein the electrical component is a digital contacting encoder, wherein:
   each said strip has the form of a cog pattern, including a series of laterally extended, longitudinally spaced cogs emanating from a base strip;
   each via underlies a laterally extended cog of its respective strip.

8. The electrical component of claim 7, wherein:
   each via separately includes an oblong-shaped, laterally extended hole defining said opening through said substrate.

9. The electrical component of claim 7, wherein the encoder is of the rotary type, and wherein:
   there is at least one additional strip formed on said top side of said substrate, the two strips being in the form of two, concentric, circular, conductive cog rings, an inner cog ring and an outer cog ring, each said cog ring having a ring base and a series of peripherally spaced, opposed, radially extended cogs extending into a central area emanating from the ring bases;
   said conductive layer is in the form of at least two, concentric, circular, conductive layer rings electrically isolated from one another and located at said underside of said insulating substrate between said insulating substrate and said base substantially coincident with said cog rings, said layer rings each being separately electrically connected with its respective cog ring and a respective one of said externally exposed contacts, said conductive layer providing separate conductive paths between said externally exposed contacts and their respective cog rings; and wherein there is included:
   at least a second via, each of the two vias underlying a laterally extending cog, said one via being under and in electrical contact with a cog of said inner cog ring and the other, second via underlying and being in electrical contact with a laterally extended cog on said outer cog ring.

10. The electrical component of claim 9, wherein:
    there is at least one additional, externally exposed, strip contact, the strip contacts both lying on the periphery of a circle, with said common contact being at the center of said circle, said circle being coincident with one of said conductive layer rings.

11. The electrical component of claim 10, wherein:
    one of said two, concentric, conductive layer rings defines a circle with a gap in its periphery, while the other of said two conductive layer rings forms a complete circle with an integral, radially extending arm extending into said gap, one of said strip contacts being located under said gap in electrical communication with said arm.

* * * * *

UNITED STATES PATENT AND TRADEMARK OFFICE
CERTIFICATE OF CORRECTION

PATENT NO. : 5,017,741

DATED : May 21, 1991

INVENTOR(S) : Kenneth Brown et al

It is certified that error appears in the above-identified patent and that said Letters Patent is hereby corrected as shown below:

Col. 5, line 2, after "shaft", "I" should be --1--.

Col. 7, line 28, "w" should --with--.

Col. 7, line 30, "52320" should be --520--.

Col. 7, line 61, "51!B" should be --511--.

Signed and Sealed this

Twentieth Day of October, 1992

*Attest:*

DOUGLAS B. COMER

*Attesting Officer*      *Acting Commissioner of Patents and Trademarks*